United States Patent

Igarashi et al.

[11] Patent Number: 5,900,782
[45] Date of Patent: * May 4, 1999

[54] AGC VOLTAGE CORRECTION CIRCUIT

[75] Inventors: Sadao Igarashi; Kazuharu Aoki; Satoshi Urabe, all of Fukushima-ken, Japan

[73] Assignee: Alps Electric Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/843,498

[22] Filed: Apr. 16, 1997

[30] Foreign Application Priority Data

Apr. 23, 1996 [JP] Japan .................................. 8-101306

[51] Int. Cl.⁶ ...................................................... H03F 3/45
[52] U.S. Cl. ............................................ 330/254; 330/256
[58] Field of Search .................................. 330/254, 256, 330/279, 289

[56] References Cited

U.S. PATENT DOCUMENTS

| | | | |
|---|---|---|---|
| 4,101,841 | 7/1978 | Okada et al. | 330/254 |
| 4,636,742 | 1/1987 | Oritani | 330/256 |
| 4,963,836 | 10/1990 | Noguchi et al. | 330/254 |
| 5,030,923 | 7/1991 | Arai | 330/254 |
| 5,327,097 | 7/1994 | Igarashi et al. | 330/254 |

FOREIGN PATENT DOCUMENTS

| | | |
|---|---|---|
| 2 280 073 | 1/1995 | Canada . |
| 0490016A1 | 6/1992 | European Pat. Off. . |
| 2230153 | 10/1990 | United Kingdom . |
| 2250649 | 6/1992 | United Kingdom . |

*Primary Examiner*—Benny T. Lee
*Assistant Examiner*—Khanh V. Nguyen
*Attorney, Agent, or Firm*—Brinks Hofer Gilson & Lione

[57] ABSTRACT

An object of the present invention is to provide an AGC voltage correction circuit unaffected by a change in temperature.

Since base-emitter voltages $V_{BE}$ of transistors Q9 and Q10 constituting a first reference current source 7 have temperature dependency, the variations of the gains of amplification transistors Q17 and Q18 dependent on temperature are diminished. Since transistors Q1 and Q2 constituting a second reference current source 2 have temperature dependency, a gain slope concerning amplification transistors Q17 and Q18 relative to temperature is corrected linearly.

13 Claims, 8 Drawing Sheets

AGC VOLTAGE CORRECTION CIRCUIT

BACKGROUND OF THE INVENTION

1. Field of the Invention

The present invention relates to an AGC voltage correction circuit preferable for a stage of radio-frequency amplification or intermediate-frequency amplification in a portable telephone of, for example, a code division multi-access (CDMA) type.

2. Description of the Related Art

In general, a CDMA type portable telephone has a variable gain amplification circuit (hereinafter, a variable amplification circuit) capable of varying a gain of 80 dB or more included in a reception unit or transmission unit for the purpose of retaining uniformly a signal strength for reception and the strength of a signal reaching a base station. FIG. 9 shows a typical variable amplification circuit formed with a differential amplification circuit composed of amplification transistors Q17 and 018, current source transistor Q19, and load resistors R8 and R9 connected to transistors Q17 and Q18 respectively. Also shown are input terminal IN, output terminal OUT, AGC (gain control) voltage $V_{AGC}$, and supply voltage $V_{cc}$.

Gain PC [dB] in the foregoing circuitry has the following relationship:

$$PG \propto 20 \log (I1 * q/kT) \tag{1}$$

The following relationship is also established:

$$I1 \propto Is * \exp\{V_{AGC} * q/(kT)\} \tag{2}$$

where q denotes a unit charge of an electron, k denotes a Boltzmann's constant, T denotes an absolute temperature, and Is denotes an inverse saturation current.

The expression (1) is concerned with transistors Q17 and Q18, and stipulates that when a current (collector current of the transistor Q19) supplied from a constant current source is controlled exponentially, power gain PG [dB] varies linearly. FIG. 10 shows experimental values indicating the relationship between current I1 and gain PG [dB] in the circuit shown in FIG. 9 relative to different frequencies. According to the expression (1), when collector current I1 is changed to be ten times larger, gain PG varies by 20 dB. The results of an experiment also demonstrate like the expression (1) that when current I1 changes from 0.1 mA to 1 mA, gain PG varies by approximately 20 dB. Transistor Q19 employed herein causes a current of 20 mA to flow at cutoff frequency Ft of a maximum value. The expression (1) is established with a current that is a one-tenth of the current flowing at cutoff frequency Ft of the maximum value.

The expression (2) stipulates that collector current I1 changes exponentially relative to AGC voltage $V_{AGC}$ that varies linearly. Power gain PG [dB] of the variable amplification circuit shown in FIG. 9 also varies linearly relative to AGC voltage $V_{AGC}$, which varies linearly, with a current that is a one-tenth or smaller of the current flowing at cutoff frequency Ft of the maximum value, that is, 2 mA or less.

Next, a variation dependent on temperature will be described. According to the expression (1), when temperature changes from 25° C. (T=298) to 75° C. (T=348), even if collector current I1 of the current source transistor Q19 is held constant, a gain decreases by approximately 1.4 dB (cause 1). Moreover, the gain rises with a temperature change in a negative direction. For realizing a gain or 80 dB or more in a variable amplification circuit employed in an ordinary CDMA type portable telephone, a circuit made by cascading three or four stages of variable amplification circuits each like the one shown in FIG. 9 is usually adopted. For a temperature change from 25° C. to 75° C., the gain varies by 4 to 5 dB (number of stages * 1.4 dB per 50° C.).

In consideration of the fact that inverse saturation current Is has a temperature characteristic, simulation is carried out using SPICE, and collector current I1 of a standard bipolar transistor relative to AGC voltage $V_{AGC}$ is calculated using the expression (2). The resultant values are as shown in FIG. 11. As seen from FIG. 11, collector current I1 varies greatly with a temperature change. For example, even when AGC voltage $V_{AGC}$ remains constant, if a temperature changes from 25° C. to 75° C., collector current I1 changes to be ten times or more larger. As a result, the gains of transistors Q17 and Q18 vary by 20 dB or more (cause 2). This phenomenon leads to a variation by 60 dB (3*20 dB per 50° C.) of the gain of the triple-stage variable amplification circuit.

Moreover, a rate of change in collector current I1 relative to AGC voltage $V_{AGC}$, or in other words, a gain variation rate (gain slope) varies depending on temperature (cause 3).

When bipolar transistors are used to construct a variable amplification circuit capable of varying a gain thereof within a range of 80 dB or more which is necessary for a CDMA type portable telephone, there arise problems set forth below.

1. Gain PG of the variable amplification circuit varies greatly depending on temperature because of the temperature dependency of the gains of amplification transistors Q17 and Q18 (cause 1) and the temperature dependency of the current source transistor Q19 (cause 2).

2. The gain variation rate (gain slope) relative to AGC voltage $V_{AGC}$ varies greatly depending on temperature because of the temperature dependency of the current source transistor Q19 (cause 3).

3. The gain slope has, as shown in FIG. 10, scales in an area, which are associated with larger values of collector current I1, spaced narrowly, and the linearity of the gain slope deteriorates in the area. Moreover, in an area of scales associated with smaller values of collector current I1, the gain decreases sharply because of the frequency characteristic of cutoff frequency Ft (that is, cutoff frequency Ft is proportional to collector current I1), and the linearity of the gain slope deteriorates.

4. When three or four stages of variable amplification circuits are included to realize a gain of 80 dB or more, gains of stages become mutually different because of differences among transistors or resistors. For correcting the difference, if a variable resistor or any other adjusting means is included in an input stage or output stage, isolation of radio-frequency circuit elements becomes inefficient. Eventually, a gain variable range gets narrower or the linearity of a gain slope deteriorates.

SUMMARY OF THE INVENTION

Accordingly, an object of the present invention is to provide an AGC voltage correction circuit capable of enabling a variable amplification circuit to achieve an AGC operation without the influence of a temperature change.

For accomplishing the above object, according to the present invention, a first reference current that varies depending on temperature is generated in order to cancel out the temperature dependency of a pair of amplification transistors and a current source transistor, which constitute a variable amplification circuit, and a correction AGC voltage associated with the first reference current is applied to a current source transistor.

For linearizing a gain slope concerning a variable amplifier, a second reference current that varies depending on temperature is generated, and a correction AGC voltage associated with the second reference current is applied to the current source transistor.

According to the present invention, the temperature dependency of the pair of transistors and current source transistor, which constitute the variable amplification circuit, is corrected owing mainly to the temperature dependency of the first reference current. Moreover, the gain slope concerning the variable amplification circuit is corrected linearly owing to the temperature dependency of the second reference current. Consequently, an AGC voltage correction circuit capable of enabling an AGC operation without any influence of a temperature change can be realized.

A mode for carrying out the present invention is characterized by the inclusion of a first reference current source for generating a first reference current that has temperature dependency, a second reference current source for generating a second reference current that has temperature dependency, an AGC voltage control unit that operates with a current proportional to the second reference current and outputs an adjustment current associated with a supplied AGC voltage, and an AGC voltage generator for outputting a correction AGC voltage associated with a sum of the first reference current and adjustment current.

Another mode for carrying out the present invention is characterized by the inclusion of a second reference current source, made by connecting one or more diode-connected transistors and a resistor in series, for generating a second reference current that has temperature dependency, a differential amplification stage in which an AGC voltage is applied to one input terminal and a reference voltage is applied to the other input terminal, a first constant current source, in which a first constant current proportional to the second reference current flows, connected to drive the differential amplification stage with the first constant current, a second constant current source connected so that a second constant current that is proportional to the second reference current and is a half of the first constant current can flow, an AGC voltage control unit for outputting an adjustment current corresponding to a difference between an output current of the differential amplification stage and the second constant current, and an AGC voltage generator for generating a correction AGC voltage based on the adjustment current.

In these modes for carrying out the present invention, an AGC voltage correction circuit comprises a first reference current source, made by connecting one or more diode-connected transistors and a resistor in series, for generating a first reference current that has temperature dependency, and a current-voltage conversion stage for generating a correction AGC voltage proportional to a sum of a first reference current and an adjustment current.

Moreover, the AGC voltage correction circuit is characterized in that connections between the second reference current source and the first constant current source and second constant current source are carried out in the form of a current mirror.

Moreover, the AGC voltage correction circuit is characterized in that an AGC voltage generator includes a diode-connected output transistor, and the output transistor is connected to a constant current source transistor for supplying a constant current to a signal amplification transistor differential amplifier in the form of a current mirror.

Moreover, the AGC voltage correction circuit is characterized in that the output transistor has an emitter thereof grounded via a resistor.

Moreover, the AGC voltage correction circuit is characterized in that a resistor is connected between the collector and emitter of the constant current source transistor.

DESCRIPTION OF THE EMBODIMENTS

Figure 1:
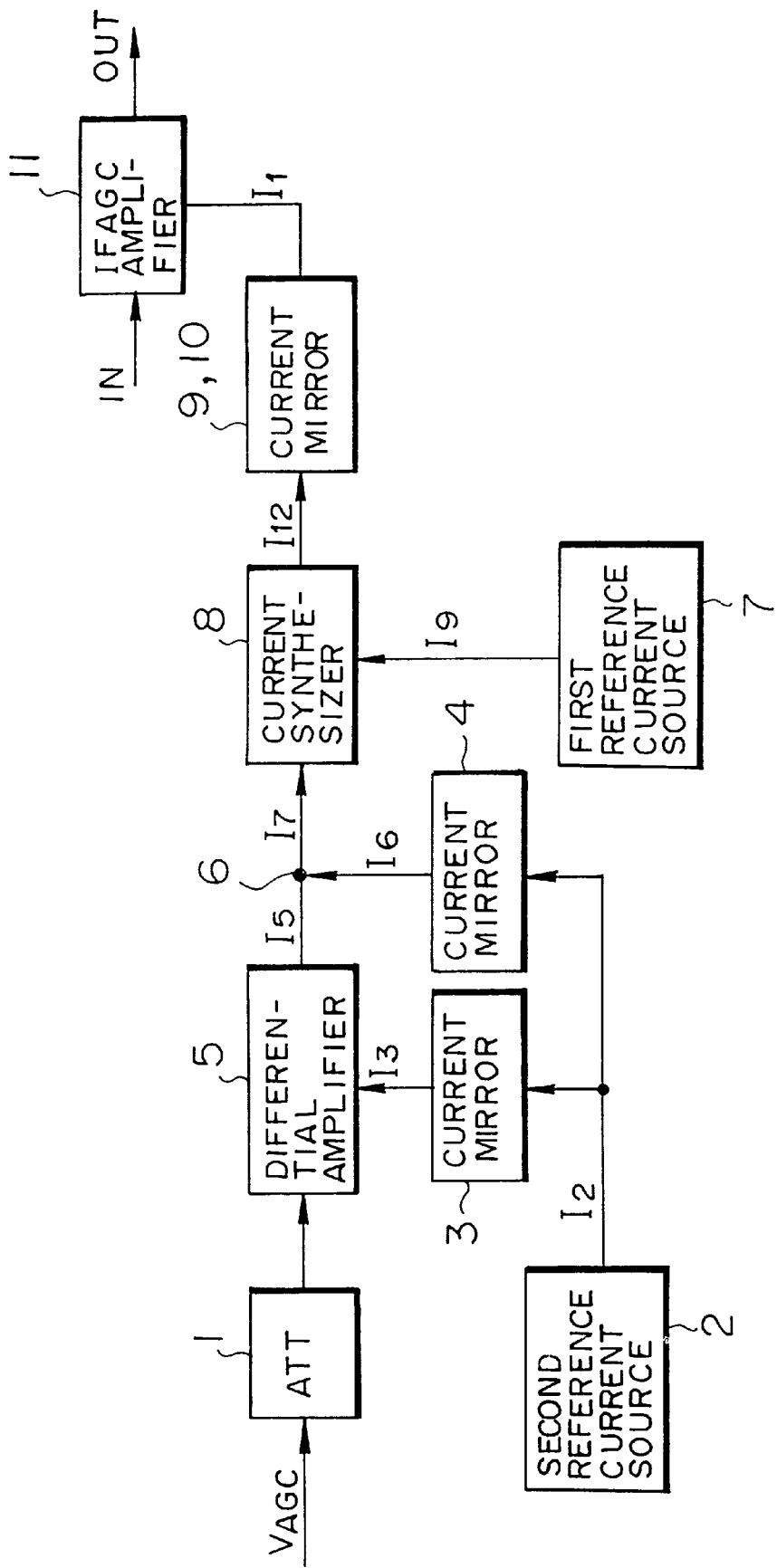
FIG. 1 is a block diagram showing an embodiment of an AGC voltage correction circuit in accordance with the present invention.

Referring to the drawings, an embodiment of the present invention will be described below.

Figure 2:
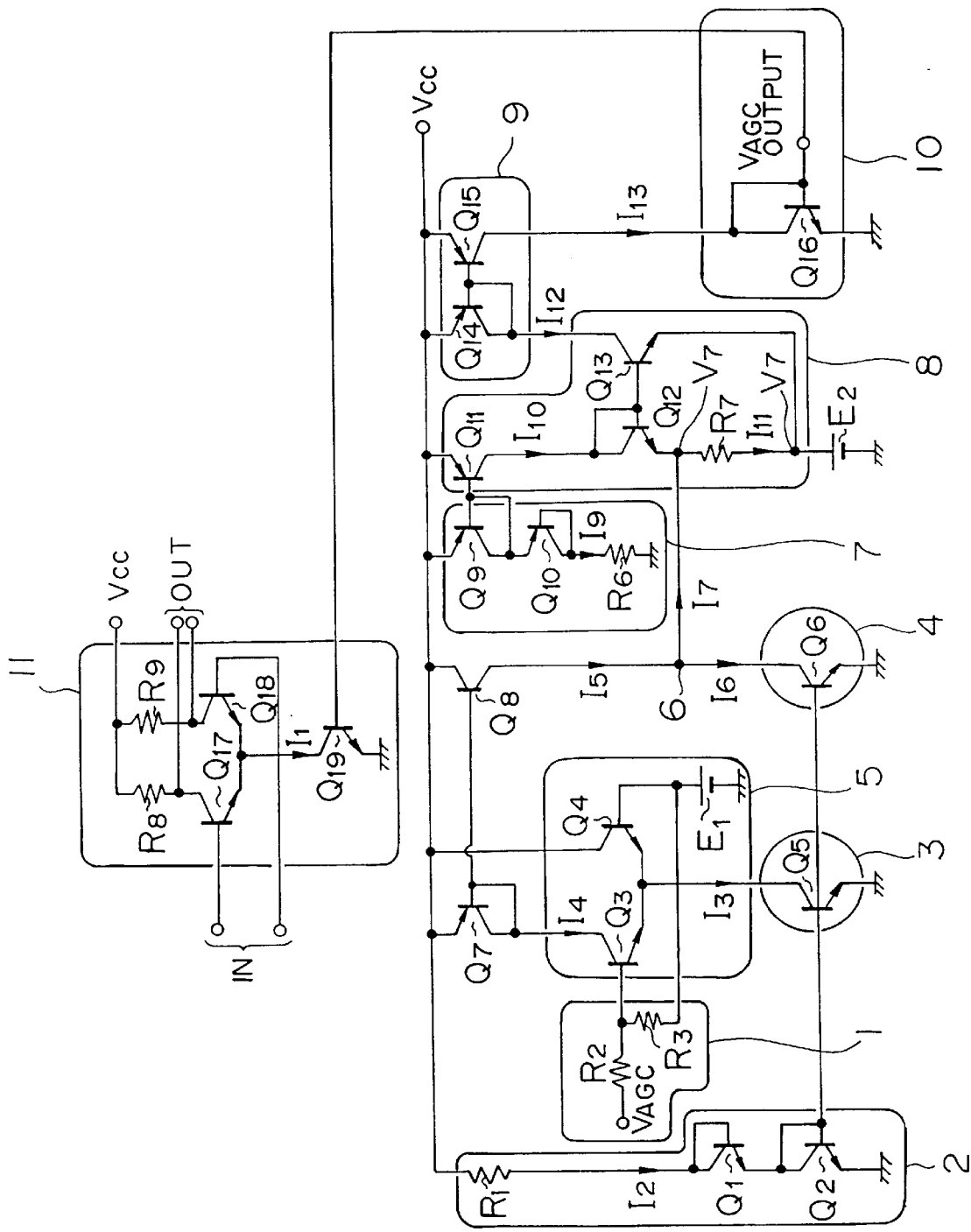
FIG. 2 is a circuit diagram showing the AGC voltage correction circuit shown in FIG. 1 in detail.
Figure 3:
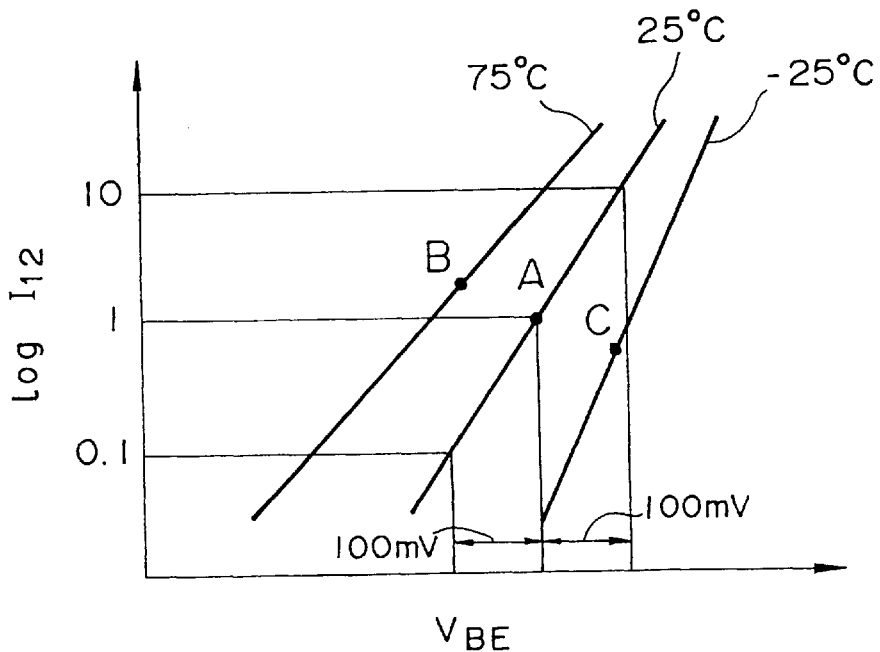
FIG. 3 is an explanatory diagram showing the relationship between a base-emitter voltage and collector current relative to temperatures in a transistor included in a current synthesis circuit shown in FIG. 2.
Figure 4:
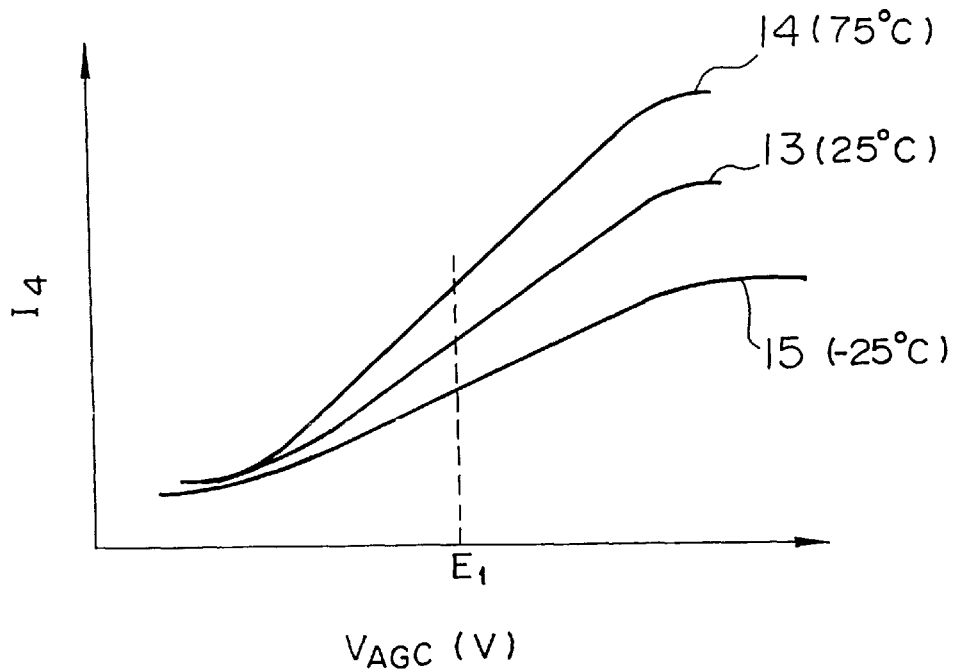
FIG. 4 is an explanatory diagram showing the relationship between an AGC voltage and collector current relative to temperatures in a differential amplification circuit that is part of the circuitry shown in FIG. 2.
Figure 5:
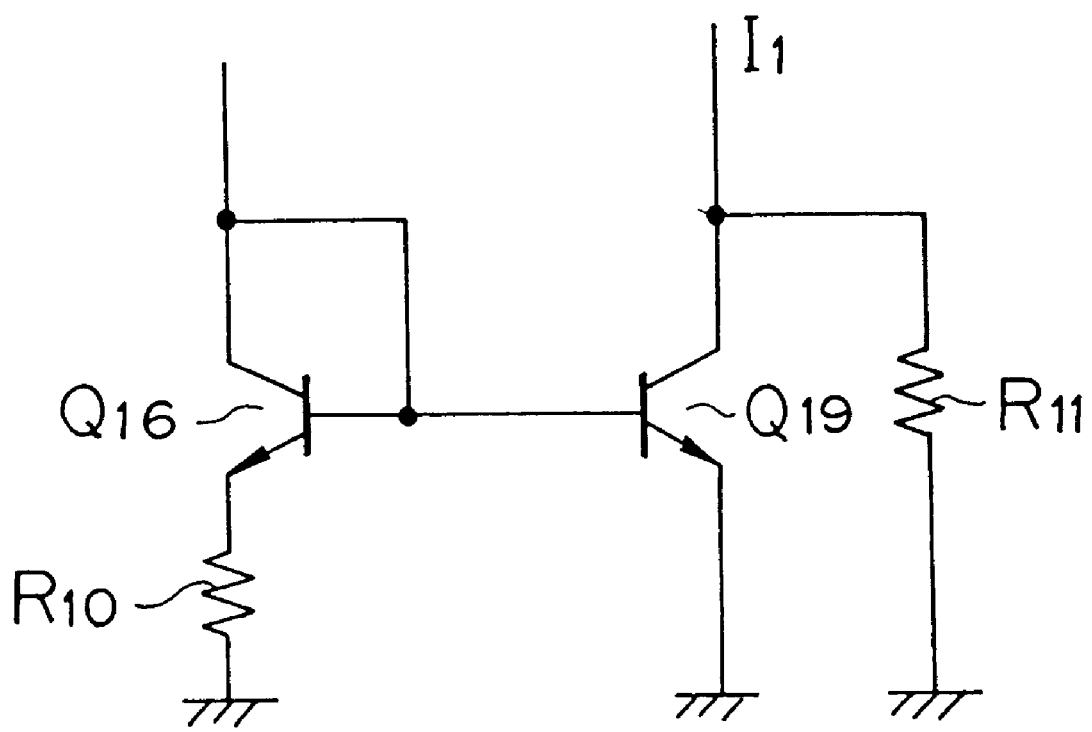
FIG. 5 is a circuit diagram showing a variant of a major portion of the AGC voltage correction circuit shown in FIGS. 1 and 2.
Figure 6:
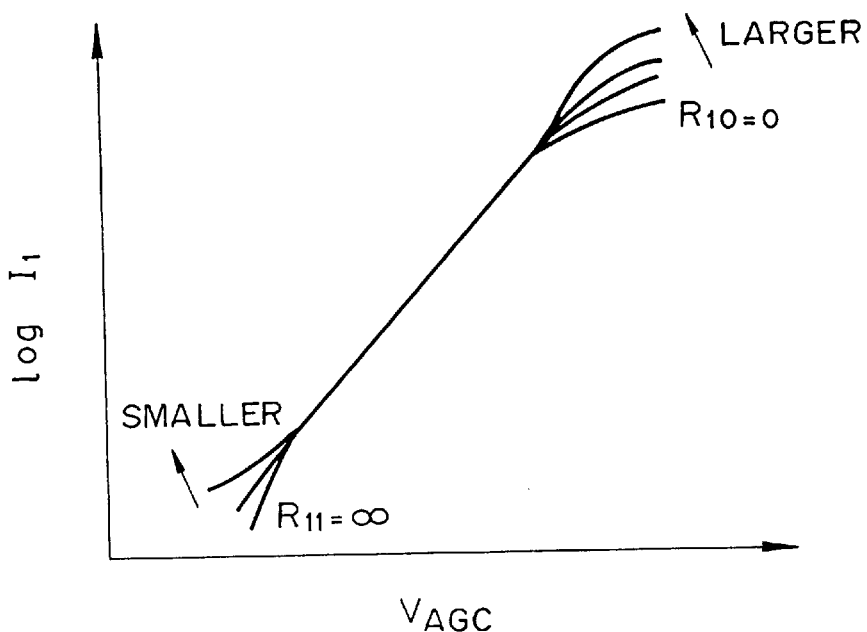
FIG. 6 is an explanatory diagram concerning a gain slope determined by the circuit shown in FIG. 5.
Figure 7:
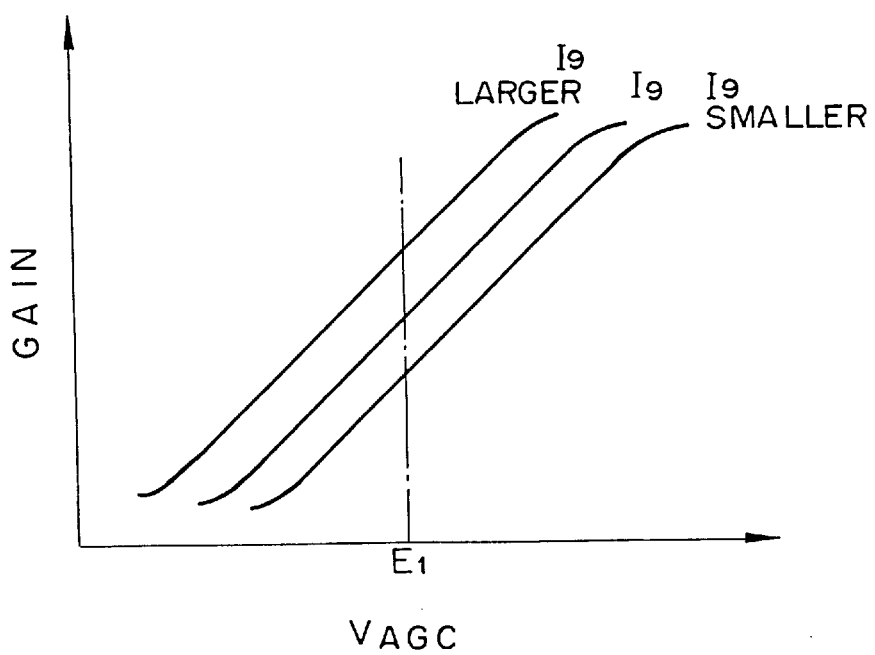
FIG. 7 is an explanatory diagram showing a gain slope determined by an attenuation circuit that is part of the circuitry shown in FIGS. 1 and 2.
Figure 8:
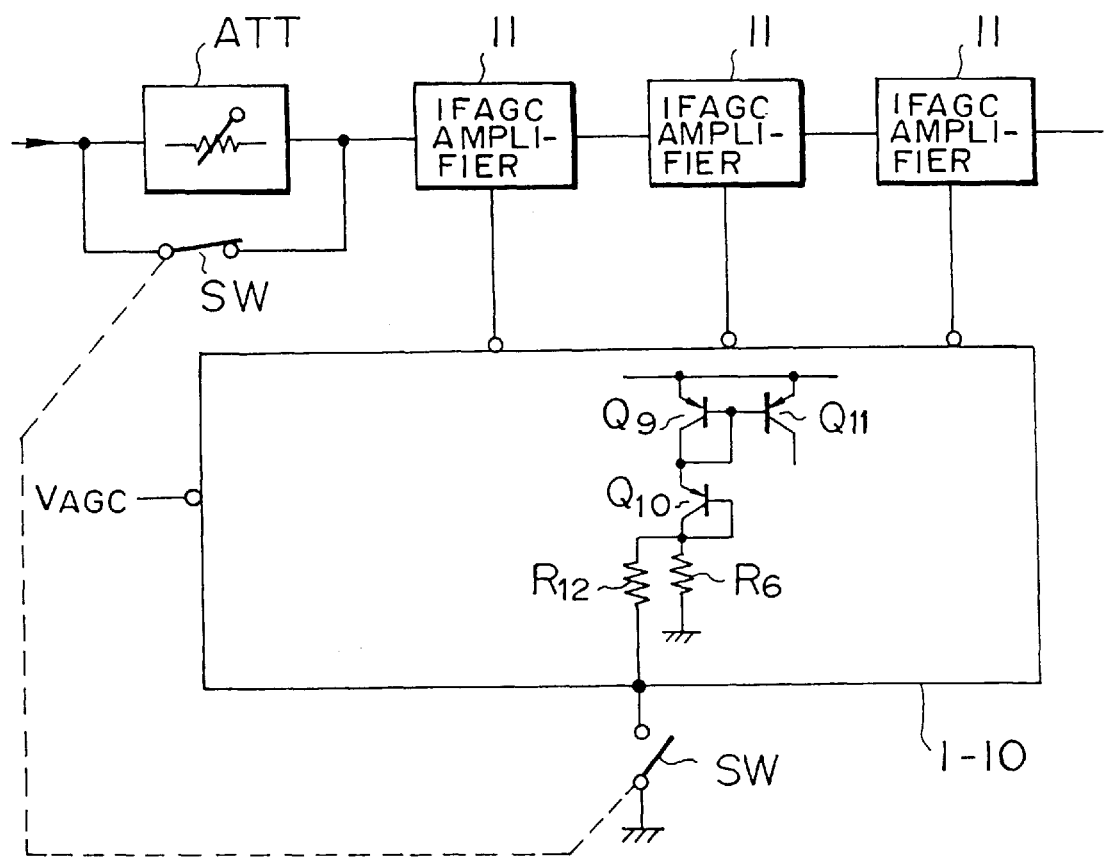
FIG. 8 is a block diagram showing a configuration in which a variable amplification circuit that is part of the circuitry shown in FIGS. 1 and 2 is connected in multiple stages.
Figure 9:
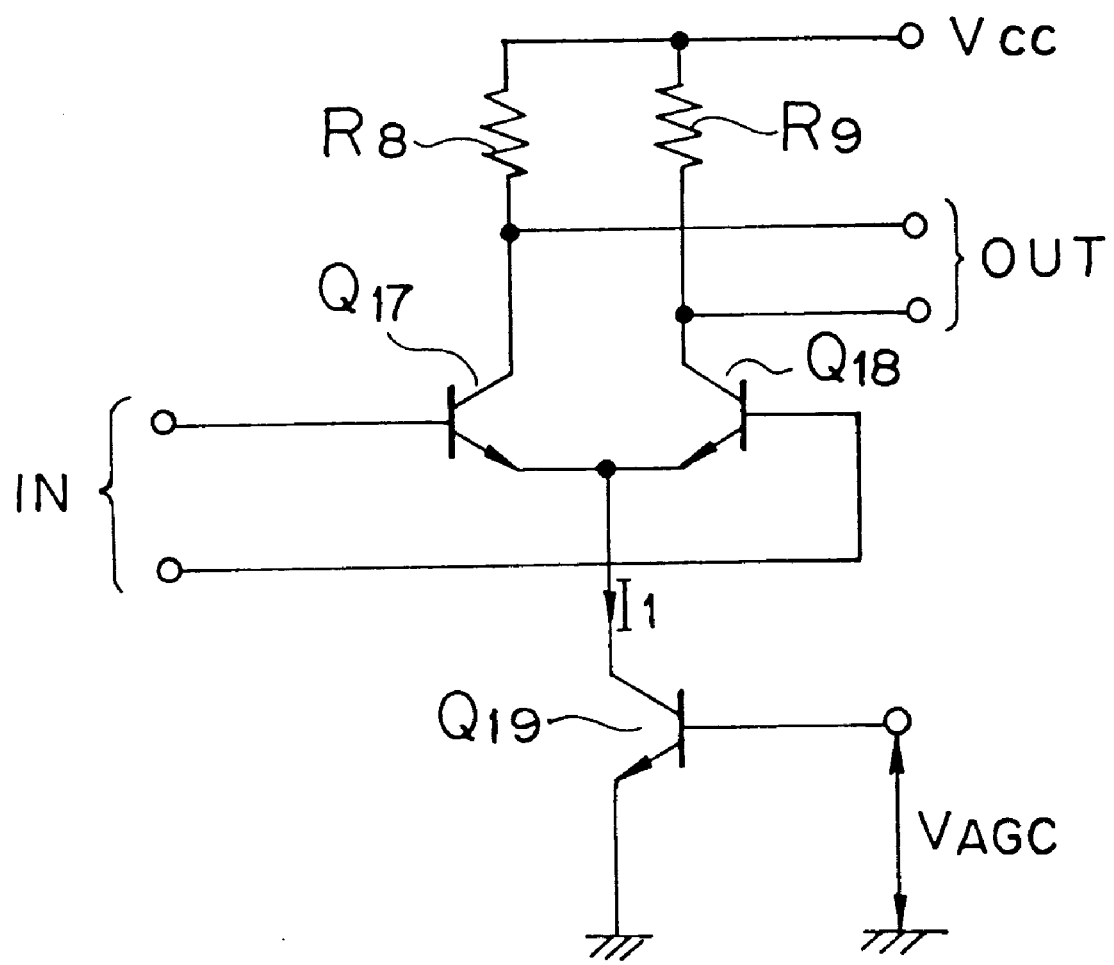
FIG. 9 is a circuit diagram showing a typical variable amplification circuit formed with a differential amplifier.
Figure 10:
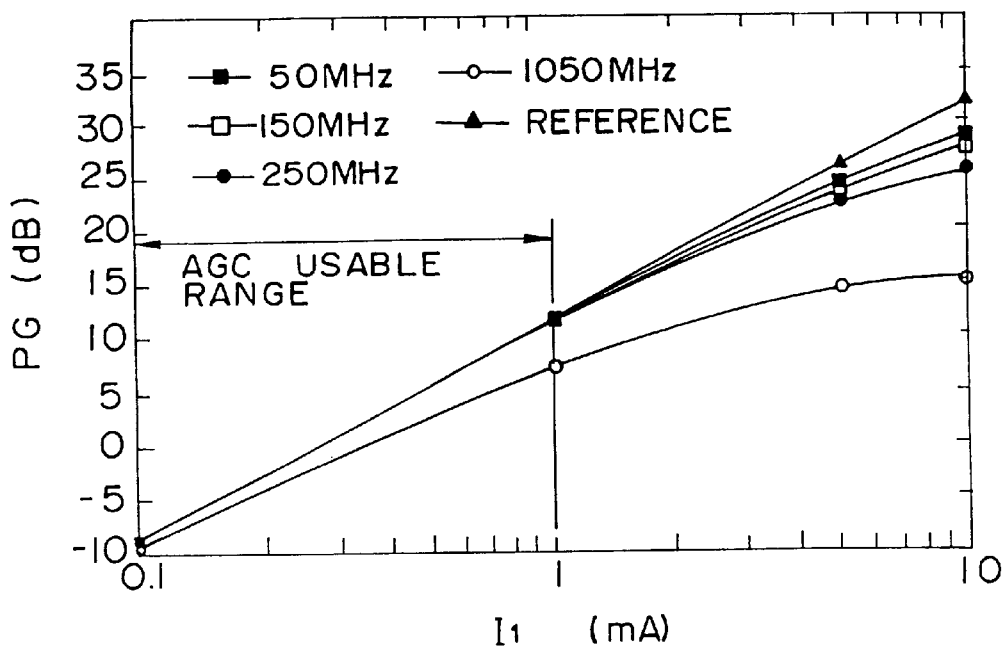
FIG. 10 is an explanatory diagram showing the relationship between a collector current of a constant current source transistor shown in FIG. 9 and a gain.

FIG. 1 is a block diagram showing an embodiment of an AGC voltage correction circuit in accordance with the present invention, FIG. 2 is a circuit diagram showing the AGC voltage correction circuit shown in FIG. 1 in detail, and FIG. 3 is an explanatory diagram showing the relationship between a base-emitter voltage and collector current relative to temperatures in transistor Q13 included in a current synthesis circuit 8 shown in FIG. 2. FIG. 4 is an explanatory diagram showing the relationship between an AGC voltage and collector current relative to temperatures in a differential amplification circuit 5 that is part of the circuitry shown in FIG. 2, FIG. 5 is a circuit diagram showing a variant of a major portion of the AGC voltage correction circuit shown in FIGS. 1 and 2, FIG. 6 is an explanatory diagram concerning a gain slope determined by the circuit shown in FIG. 5, FIG. 7 is an explanatory diagram showing a gain slope determined by an attenuation circuit 1 that is part of the circuitry shown in FIGS. 1 and 2, and FIG. 8 is a block diagram showing a configuration in which a variable amplification circuit (IFAGC amplifier) that is part of the circuitry shown in FIGS. 1 and 2 is connected in multiple stages.

In FIG. 1, a variable amplification circuit (IFGC amplifier) 11 amplifies input signal IN having an intermediate frequency by a variable gain, and outputs signal OUT. The gain of the variable amplification circuit 11 is controlled on the basis of AGC voltage $V_{AGC}$ by means of circuits 1 to 10. AGC voltage $V_{AGC}$ is applied to a differential amplification circuit (amplifier) 5 after being attenuated by an attenuation circuit (ATT) 1. The differential amplification circuit 5 in turn outputs current I5 proportional to AGC voltage $V_{AGC}$. A second reference current source 2 generates second reference current I2 dependent on temperature so that a gain slope concerning the variable amplification circuit 11 will become linear, and supplies the second reference current to current mirrors 3 and 4.

The current mirror 3 supplies first constant current I3 associated with second reference current I2 to the differential amplification circuit 5. Output current I5 of the differential amplification circuit 5 is controlled with AGC voltage $V_{AGC}$ and first constant current I3. The current mirror 4 outputs second constant current I6 associated with second reference current I2. Output current I5 and second constant current I6 are summated at a node 6. A first reference current source 7 generates first reference current I9 dependent on temperature so that the temperature dependency of the variable amplification circuit 11 can be canceled out. Current I7 resulting from the summation at the node 6 and first reference current I9 are synthesized by a current synthesis circuit 8. Current I12 resulting from the synthesis by the current synthesis circuit 8 is supplied to a current source transistor in the variable amplification circuit 11 via the current mirrors 9 and 10, whereby collector current I1 is generated.

Referring to FIG. 2, the circuitry will be described. In FIG. 2, circuits corresponding to the components shown in FIG. 1 are delineated and assigned the same reference numerals.

Supply voltage $V_{cc}$ is applied to each of one terminal of resistor R1, an emitter of PNP transistor Q7, a collector of NPN transistor Q4, emitters of PNP transistors Q8, Q9, Q11, Q14, and Q15, and one terminals of resistors R8 and R9. The other terminal of resistor R1 (current I2) is connected to a collector and base of diode-connected NPN transistor Q1. The emitter of transistor Q1 is connected to a collector and base of diode-connected NPN transistor Q2. Transistor Q2 has a base thereof connected to the bases of NPN transistors Q5 and Q6, and an emitter thereof grounded. These resistor R1 and transistors Q1 and Q2 constitute a second reference current source 2 for compensating a gain slope relative to temperature. Transistor Q1 may be excluded.

AGC voltage $V_{AGC}$ is applied to one terminal of resistor R2. The other terminal of resistor R2 is connected to a base of NPN transistor Q3 and one terminal of resistor R3. Resistors R2 and R3 constitute the attenuation circuit (ATT) 1 for attenuating AGC voltage $V_{AGC}$ so as to optimize a gain slope according to a change in temperature. The other terminal of resistor R3 is connected to a base of transistor Q4 and grounded via a bias source for generating bias voltage E1.

Diode-connected transistor Q7 has a base and collector thereof strapped, and has the base thereof connected to a base of transistor Q8 and a collector of transistor Q3 (output current I4). Emitters of transistors Q3 and Q4 are connected to a collector of transistor Q5 (first constant current source I3). A collector of transistor Q8 (current I5) is connected to a collector of transistor Q6 (second constant current I6) via the node 6. Emitters of transistors Q5 and Q6 are grounded.

The node 6 is connected to a node between the emitter of transistor Q12 and resistor R7. Adjustment current I7 is output through the node 6.

Transistors Q3 and Q4 and the bias source constitute the differential amplification circuit 5 for compensating a gain slope. Transistors Q2 and Q5 constitute the current mirror 3 serving as a current source for the differential amplification circuit 5, and transistors Q2 and Q6 constitute the current mirror 4. Transistors Q7 and Q8 also constitute the current mirror.

Transistor Q9 has a base and collector thereof strapped, and has the base thereof connected to an emitter of PNP transistor Q10 and a base of transistor Q11. Transistors Q9 and Q11 constitute a current mirror. Transistor Q10 has a base and collector thereof strapped, and has the base thereof connected to one terminal of current limitation resistor R6 (first reference current I9). The other terminal of resistor R6 is grounded. Transistors Q9 and Q10 and resistor R6 constitute the first reference current source 7 for compensating the gains of transistors relative to temperature. Transistor Q10 may be excluded.

A collector of transistor Q11 (current I10) is connected to a base and collector of diode-connected NPN transistor Q12 and a base of NPN transistor Q13. An emitter of transistor Q12 is grounded via resistor R7 (current I11=I7+I10) and a bias source for generating bias voltage E2. Transistors Q11, Q12, and Q13 and resistor R7 constitute the current synthesis circuit 8 for synthesizing adjustment current I7 supplied through the node 6 and first reference current I9 supplied from the first reference current source 7. Transistors Q12 and Q13 constitute a current mirror.

Bases of transistors Q14 and Q15 are connected in common to a collector of transistor Q14 and a collector of transistor Q13 (current I12). An emitter of transistor Q13 is connected to a node between resistor R7 and the bias source for generating bias voltage E2. Transistors Q14 and Q15 constitute the current mirror 9 serving as a current source. A collector of transistor Q15 (current I13) is connected to a collector and base of NPN output transistor Q16 and a base of NPN current source transistor Q19. An emitter of output transistor Q16 is grounded. Output transistor Q16 and current source transistor Q19 constitute the current mirror 10.

The other terminals of resistors R8 and R9 are connected to collectors of NPN transistors Q17 and Q18. Emitters of transistors Q17 and Q18 are connected in common to a collector of current source transistor Q19 (current I1). Input signal In is applied to bases of transistors Q17 and Q18, and output signal OUT is extracted from the collectors of transistors Q17 and Q18. These resistors R8 and R9, and transistors Q17, Q18, and Q19 constitute the variable amplification circuit 11 for gain variation.

In the foregoing circuitry, an emitter current of output transistor Q16 is controlled with collector current I13 of transistor Q15. An emitter current of transistor Q14 is controlled with collector current I12 of transistor Q13. An emitter current of transistor Q12 is controlled with collector current I10 of transistor Q11. In this embodiment, voltage V7 across resistor R7 is set to be larger than 0.7 V. An emitter current of transistor Q12 is dependent on first reference current I9 output from the first reference current source 7. A current proportional to first reference current I9 therefore flows into transistors Q17 and Q18 constituting the variable amplification circuit 11.

In this circuitry, the temperature dependency of base-emitter voltages $V_{BE}$ of transistors Q9 and Q10 constituting the first reference current source 7 is utilized so that first reference current I9 gets larger at high temperature and gets smaller at low temperature. Specifically, first reference current I9 is set so that at 75° C., it gets approximately 1.18 times larger than that at 25° C., and at −25° C., it gets approximately 0.85 times larger than that at 25° C. A collector current (I12) of transistor Q13 in the current synthesis circuit 8 assumes the values at point A (25° C.), point B (75° C.), and point C (−25° C.) shown in FIG. 3.

As a result, the gains of transistors Q17 and Q18 are corrected by 1.4 dB per 50° C., that is, corrected by +1.4 dB at 75° and by about −1.4 dB at −25° C. The variations of the gains of transistors Q17 and Q18 dependent on temperature are therefore canceled out. Thus, since the first reference current source 7 has temperature dependency, the variations of the gains of transistors Q17 and Q18 dependent on temperature can be minimized. The aforesaid problem deriving from cause 1 can be solved.

Next, a variation of a gain will be described. Gain variation is carried out by varying voltage V7 across resistor R7 with AGC voltage $V_{AGC}$. Herein, since the relationship below is established, when adjustment current I7 supplied through the node 6 is changed, voltage V7 varies.

$$V7 = I11 * R7$$
$$= (I7 + I10) * R7$$

Moreover, since a voltage corresponding to a sum of base-emitter voltage $V_{BE}$ of transistor Q12 and voltage V7 is applied to the base through emitter of transistor Q13. Collector current I12 of transistor Q13 is therefore controlled with adjustment current I7. Specifically, as shown in FIG. 3, when voltage $V_{BE}$ to be applied to the base through emitter of transistor Q13 varies by ±100 mV, collector current I12 of transistor Q13 gets approximately ten times larger or becomes an approximately one-tenth. Consequently, the gains of transistors Q17 and Q18 vary by ±20 dB.

Next, adjustment current I7 will be described. A circuit portion including the components 1 to 5 acts as an AGC voltage control unit for compensating AGC voltage $V_{AGC}$ relative to temperature and correcting a gain slope that differs from one to another with temperature. First, AGC voltage $V_{AGC}$ is attenuated by the attenuation circuit 1 in order to optimize a gain slope. The resultant voltage is then applied to the bases of transistors Q3 and Q4 constituting the differential amplification circuit 5. Collector current I4 of transistor Q3 therefore varies depending on AGC voltage $V_{AGC}$.

Transistor Q5 generates first constant current I3 with which the differential amplification circuit 5 operates. First constant current I3 is determined with the current mirror 3 including transistor Q2. The second reference current source 2 composed of transistors Q1 and Q2 and resistor R1 determines second reference current I2. Furthermore, since transistors Q7 and Q8 constitute a current mirror, current I5 corresponding to collector current (output current) I4 of transistor Q3 (I4=I5) flows into the collector of transistor Q8. Moreover, since transistors Q6 and Q2 constitute a current mirror, collector current (second constant current) I6 determined with first reference current I2 supplied from the first reference current source 2 flows into transistor Q6.

The cell size for transistor Q6 is set to a half of that for transistor Q5. The following relationship is therefore established:

$$I6 = I3/2$$

When AGC voltage $V_{AGC}$ is equal to bias voltage E1, the following relationship is established:

$$I4 = I3/2$$

Moreover, since I5=I4,I5=I6.
Moreover, since I7=I5−I6, the following relationships are established:

if $V_{AGC}$=E1, then I5=I6

∴I7=0 if $V_{AGC}$>E1, then I4>I3/2

I5>I6

∴I7>0 if $V_{AGC}$<E1, then I7<0

Adjustment current I7 is transmitted to transistors Q13, Q14, Q15, Q16, and Q19 successively after flowing into resistor R7. Thus, the gains of transistors Q17 and Q18 are controlled with adjustment current I7.

Figure 11:
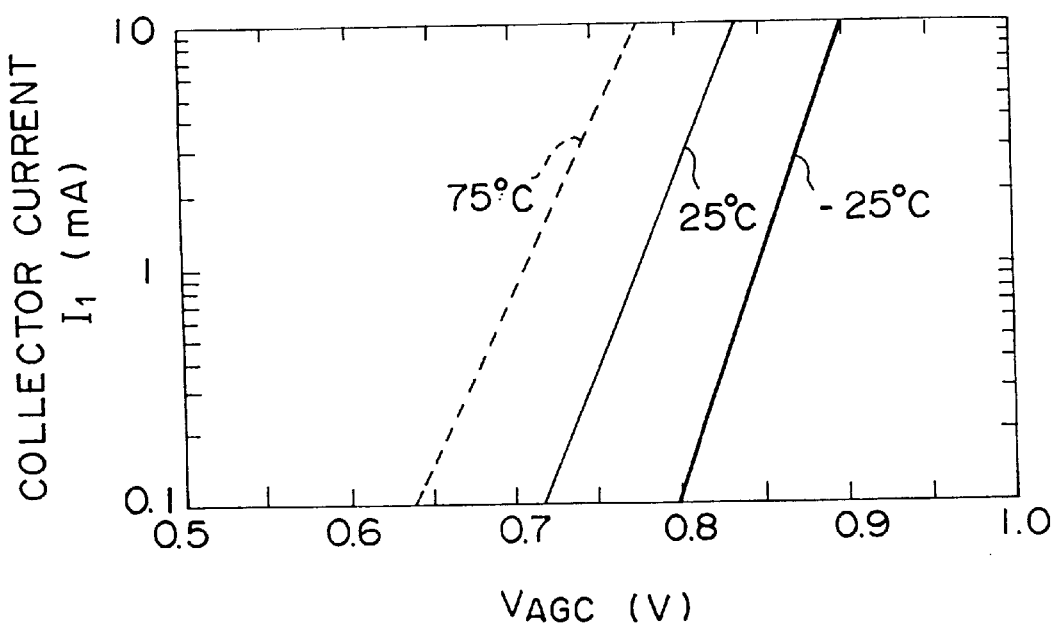
FIG. 11 is an explanatory diagram showing the relationship between an AGC voltage and the collector current of the constant current transistor shown in FIG. 9.

Referring to FIG. 4, collector current I14 of transistor Q3 constituting the differential amplification circuit 5 will be described. Curves 13, 14, and 15 in FIG. 4 indicate collector current (output current) I4 of transistor Q3 relative to AGC voltage $V_{AGC}$ at temperatures 25° C., 75° C., and −25° C. When temperature rises, collector current I4 increases. This is, as mentioned previously, attributable to the fact that when temperature rises, first constant current I3 increases. A rate of change (slope of each curve) in collector current I4 due to a change in AGC voltage varies depending on temperature. When temperature is high, that is, first constant current I3 is large, the rate of change is high. When temperature is low, that is, first constant current I3 is small, the rate of change is low. This trend is opposite to the trend of a rate of change in collector current due to a change in AGC voltage which is shown in FIG. 11.

Thus, in the aforesaid embodiment, since second reference current I2 supplied from the second reference current source 2 has temperature dependency, first constant current I3 gets larger at high temperature and gets smaller at low temperature. Moreover, since the temperature dependency of first constant current I3 influences voltage V7, a rate of change in collector current I12 of transistor Q13 included in the current synthesis circuit 8 can be held constant at each temperature.

Since collector current I1 of current source transistor Q19 is equal to collector current I12 of transistor Q13, a rate of change in collector current of current source transistor Q19 can also be held constant at each temperature.

According to the aforesaid embodiment, a) since the first reference current source 7 has temperature dependency, the variations of the gains of transistors Q17 and Q18 dependent on temperature can be minimized, and as a result, the problem deriving from cause 1 can be solved; and b) since first constant current I3 flowing in the differential amplification circuit 5 for amplifying AGC voltage $V_{AGC}$ has temperature dependency because of the second reference current source 2, the temperature characteristic of a gain slope can be improved, and as a result, the problem deriving from cause 2 can be alleviated.

According to the aforesaid embodiment, the advantages set forth below are exerted.

c) When resistor R10 is, as shown in FIG. 5, connected in series with the emitter of output transistor Q16 in the current mirror 10 composed of output transistor Q16 and current source transistor Q19, collector current I1 of transistor Q19 gets, as shown in FIG. 6, larger relative to an area of points associated with larger values of AGC voltage $V_{AGC}$ because of the presence of resistor R10. Consequently, the linearity of part of a gain slope around a point indicating a maximum gain can be improved.

d) When resistor R11 is, as shown in FIG. 5, connected between the collector of current source transistor Q19 and a ground, a current always flows through transistors Q17 and Q18. Consequently, the linearity of part of a gain slope around a point indicating the highest gain among gains at points in an area associated with small values of AGC voltage $V_{AGC}$ as shown in FIG. 6 can be improved.

e) When a variable resistor or the like is used as resistor R6 included in the first reference current source 7 in order to change first reference current I9, the gain relative to AGC voltage $V_{AGC}$ can, as shown in FIG. 7, be changed. Consequently, a difference of the gain of any circuit other than the variable amplification circuit, such as, a low-noise amplifier, mixer, or bandpass filter included in a reception unit of a portable telephone from a reference gain can be absorbed. In particular, since this adjustment is concerned with a direct-current circuit, it will hardly affect amplification of a radio-frequency signal.

f) Moreover, a gain slope can be modified arbitrarily and set owing to resistors R2 and R3 for attenuation installed in a stage preceding the differential amplification circuit 2. From this viewpoint, this embodiment can be adapted to a CDMA type portable telephone demanding that the AGC characteristic of a reception unit is consistent with that of a transmission unit.

g) When the size of a cell containing output transistor Q16 and current source transistor Q19 constituting a current mirror is set properly, the operating current for radio-frequency transistors Q17 and Q18 can be set arbitrarily. When the variable amplification circuit 11 shown in FIGS. 1 and 2 is connected in multiple stages, distortion can be set to an optimal value readily.

h) When the attenuation circuit ATT and multiple stages of variable amplification circuits (IFAGC amplifiers) 11 are connected as shown in FIG. 8, and first reference current I9 supplied from the first reference current source 7 is made switchable by resistors R6 and R12 and switch SW, if the attenuation circuit ATT is switched responsively to the switching of first reference current I9, a variation of the gain of the variable amplification circuit due to the switching of first reference current I9 can be agreed with a magnitude of attenuation achieved by the attenuation circuit ATT. As a result, the distortion characteristic of a circuit can be improved without any influence on the gain of the whole circuit. A receiver resistive to interferences can be realized. Moreover, the attenuation circuit ATT may be included in an input stage of a receiver. Even in this case, the same advantage can be exerted.

As described so far, according to an AGC voltage correction circuit of the present invention, the temperature dependency of a pair of transistors and a current source transistor which constitute a variable amplification circuit is corrected with a first reference current. Moreover, a gain slope can be corrected linearly with a second reference current. This results in a variable amplification circuit whose amplification efficiency is unaffected by a change in temperature.

What is claimed is:

1. An AGC voltage correction circuit, comprising:
   a first reference current source for generating a first reference current that has temperature dependency;
   a second reference current source for generating a second reference current that has temperature dependency;
   an AGC voltage control unit operating with a current proportional to the second reference current and outputting an adjustment current associated with a supplied AGC voltage; and
   an AGC voltage generator for outputting a correction AGC voltage associated with a sum of the first reference current and adjustment current.

2. An AGC voltage correction circuit according to claim 1, wherein said AGC voltage generator includes a diode-connected output transistor, and said output transistor is connected to a constant current transistor for supplying a constant current to a signal amplification transistor differential amplifier in the form of a current mirror.

3. An AGC voltage correction circuit according to claim 2, wherein said output transistor has an emitter thereof grounded via a resistor.

4. An AGC voltage correction circuit according to claim 2, wherein a resistor is connected between the collector and emitter of said constant current source transistor.

5. An AGC voltage correction circuit, comprising:
   a second reference current source, made by connecting one or more diode-connected transistors and a resistor in series, for generating a second reference current that has temperature dependency;
   a differential amplification stage in which an AGC voltage is applied to one input terminal and a reference voltage is applied to the other input terminal;
   a first constant current source, in which a first constant current proportional to the second reference current flows, connected to drive said differential amplification stage;
   a second constant current source connected so that a second constant current, which is proportional to the second reference current and is a half of said first constant current, flows;
   an AGC voltage control unit for outputting an adjustment current corresponding to a difference between an output current of said differential amplification stage and said second constant current; and
   an AGC voltage generator for generating a correction AGC voltage based on the adjustment current.

6. An AGC voltage correction circuit according to claim 5, further comprising a first reference current source, made by connecting one or more diode-connected transistors and a resistor in series, for generating a first reference current that has temperature dependency, and a current-voltage conversion stage for generating a correction AGC voltage proportional to a sum of the first reference current and adjustment current.

7. An AGC voltage correction circuit according to claim 5, wherein connections between said second reference current source and said first constant current source and second constant current source are carried out in the form of a current mirror.

8. An AGC voltage correction circuit according to claim 7, wherein a resistor is connected between the collector and emitter of said current source transistor.

9. An AGC voltage correction circuit according to claim 5, wherein connections between said second reference current source and said first constant current source and second constant current source are carried out in the form of a current mirror.

10. An AGC voltage correction circuit according to claim 9, wherein a resistor is connected between the collector and emitter of said current source transistor.

11. An AGC voltage correction circuit according to claim 5, wherein said AGC voltage generator includes a diode-connected output transistor, and said output transistor is connected to a constant current source transistor for supplying a constant current to a signal amplification transistor differential amplifier in the form of a current mirror.

12. An AGC voltage correction circuit according to claim 11, wherein said output transistor has an emitter thereof grounded via a resistor.

13. An AGC voltage correction circuit according to claim 11, wherein a resistor is connected between the collector and emitter of said constant current source transistor.

* * * * *